US012813101B2

(12) United States Patent
Han et al.

(10) Patent No.: US 12,813,101 B2
(45) Date of Patent: Nov. 24, 2026

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Ying Han, Beijing (CN); Pan Xu, Beijing (CN); Xing Zhang, Beijing (CN); Chengyuan Luo, Beijing (CN); Donghui Zhao, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 576 days.

(21) Appl. No.: 18/279,650

(22) PCT Filed: May 30, 2022

(86) PCT No.: PCT/CN2022/095842

§ 371 (c)(1),
(2) Date: Aug. 31, 2023

(87) PCT Pub. No.: WO2023/230741

PCT Pub. Date: Dec. 7, 2023

(65) Prior Publication Data

US 2025/0024716 A1 Jan. 16, 2025

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/122* (2023.02); *H10K 59/8052* (2023.02); *H10K 71/60* (2023.02)

(58) Field of Classification Search
CPC ............. H10K 59/131; H10K 59/1201; H10K 59/122; H10K 59/8052; H10K 71/60
See application file for complete search history.

(56) References Cited

U.S. PATENT DOCUMENTS 9,711,726 B2 7/2017 Zhao et al.
2014/0183501 A1* 7/2014 Kim .................... H10K 59/122
438/34

(Continued)

FOREIGN PATENT DOCUMENTS

CN 103882374 B 1/2016
CN 108538890 A 9/2018

(Continued)

OTHER PUBLICATIONS

Cheng et al., CN 116209314, Jun. 2, 2023 (Year: 2023).*

(Continued)

*Primary Examiner* — Mary Ellen Bowman
(74) *Attorney, Agent, or Firm* — Collard & Roe, P.C.

(57) ABSTRACT

A display panel, a manufacturing method thereof, and a display device are provided. The display panel includes: a base substrate; a conductive connection member including a separation structure; a light-emitting functional layer, located on a side of the conductive connection member facing away from the base substrate, and disconnected at the separation structure; a first electrode, located on a side of the light-emitting functional layer facing away from the base substrate, and an auxiliary electrode located on a side of the conductive connection member close to the base substrate; the first electrode is connected with the conductive connection member at the separation structure, the first electrode is connected with the auxiliary electrode through the conductive connection member, and the separation structure includes a groove, and an angle between an orientation of the groove and the base substrate is an acute angle.

20 Claims, 10 Drawing Sheets

(51) Int. Cl.

| | |
|---|---|
| ***H10K 59/122*** | (2023.01) |
| ***H10K 59/80*** | (2023.01) |
| ***H10K 71/60*** | (2023.01) |

(56) References Cited

U.S. PATENT DOCUMENTS

| | | | |
|---|---|---|---|
| 2015/0144914 | A1 | 5/2015 | Kashiwabara et al. |
| 2019/0326370 | A1 | 10/2019 | Lu |
| 2020/0203469 | A1 | 6/2020 | Li et al. |

FOREIGN PATENT DOCUMENTS

| | | | |
|---|---|---|---|
| CN | 109599429 | A | 4/2019 |
| CN | 110459583 | A | 11/2019 |
| CN | 110911461 | A | 3/2020 |
| CN | 111458916 | A | 7/2020 |
| CN | 113097265 | A | 7/2021 |
| CN | 113097416 | A | 7/2021 |
| JP | 2005093397 | A | 4/2005 |

OTHER PUBLICATIONS

International Search Report in PCT/CN2022/095842 in Chinese dated Feb. 16, 2023 with English translation.

Written Opinion of the International Searching Authority in PCT/CN2022/095842 in Chinese dated Feb. 16, 2023.

* cited by examiner

DISPLAY PANEL, MANUFACTURING METHOD THEREOF, AND DISPLAY DEVICE

CROSS REFERENCE TO RELATED APPLICATIONS

This application is the National Stage of PCT/CN2022/095842 filed on May 30, 2022, the disclosure of which is incorporated by reference.

TECHNICAL FIELD

At least one embodiment of the present disclosure relates to a display panel, a manufacturing method thereof, and a display device.

BACKGROUND

Top-emitting organic light-emitting diode (OLED) display products emit light from the cathode, thus the cathode needs to be made very thin to achieve high transmittance. However, after the cathode becomes thinner, it will cause the resistance of the cathode to increase, resulting in a larger voltage drop of the cathode and poor brightness uniformity of the final display panel.

SUMMARY

At least one embodiment of the present disclosure provides a display panel, a manufacturing method thereof, and a display device. The display panel is provided with a conductive connection member having a separation structure, to disconnect the light-emitting functional layer, thus the first electrode can be connected with the conductive connection member, so that the first electrode is connected with a lower layer component through the conductive connection member, and the display quality is improved by reducing the voltage drop of the first electrode of the display panel.

At least one embodiment of the present disclosure provides a display panel, including: a base substrate; a conductive connection member, located on the base substrate, the conductive connection member including a separation structure; a light-emitting functional layer, the light-emitting functional layer being located on a side of the conductive connection member facing away from the base substrate, and being disconnected at the separation structure; a first electrode, the first electrode being located on a side of the light-emitting functional layer facing away from the base substrate; and an auxiliary electrode, the auxiliary electrode being located on a side of the conductive connection member close to the base substrate; the first electrode is connected with the conductive connection member at the separation structure, the first electrode is connected with the auxiliary electrode through the conductive connection member, and the separation structure includes a groove, and an angle between an orientation of the groove and the base substrate is an acute angle.

For example, the conductive connection member includes a first connection electrode and a second connection electrode, the first connection electrode is closer to the base substrate than the second connection electrode, and the second connection electrode has the separation structure.

For example, the first electrode is in contact with at least a part of a side surface of the second connection electrode.

For example, an orthographic projection of the first connection electrode on the base substrate is larger than an orthographic projection of the second connection electrode on the base substrate.

For example, the first electrode is in contact with a surface of the first connection electrode facing away from the base substrate.

For example, the display panel further includes: a pixel defining pattern, the pixel defining pattern is arranged between the light-emitting functional layer and the first connection electrode, the pixel defining pattern includes a first opening, and the first opening exposes the separation structure on at least one side of the second connection electrode.

For example, the pixel defining pattern further includes a first defining structure forming at least a part of the first opening, an orthographic projection of the first defining structure on the base substrate is not overlapped with an orthographic projection of the separation structure on the base substrate, and the first defining structure is located on at least one side of the first opening.

For example, the pixel defining pattern further includes a second defining structure forming at least a part of the first opening, the second defining structure covers the separation structure on at least one side of the second connection electrode, and the second defining structure is located on at least one side of the first opening.

For example, the second connection electrode includes a first connection part and a second connection part, the first connection part is closer to the base substrate than the second connection part, and the first connection part is inwardly recessed than the second connection part at a side surface of the second connection electrode to form the groove, so as to form the separation structure.

For example, a material of the first connection part includes metal, and a material of the second connection part and a material of the first connection electrode include conductive metal oxide.

For example, a dimension of the second connection part protruding from the first connection part is greater than a thickness of the light-emitting functional layer.

For example, a length of a contact part between the first electrode and the first connection electrode is greater than a dimension of the second connection part protruding from the first connection part.

For example, the display panel further includes a functional electrode, the functional electrode is adjacent to the auxiliary electrode, an orthographic projection of the functional electrode on the base substrate is not overlapped with an orthographic projection of the auxiliary electrode on the base substrate, an orthographic projection of the separation structure on the base substrate is not overlapped with the orthographic projection of the functional electrode on the base substrate.

For example, the functional electrode is an electrode plate of a capacitor, the functional electrode is located in a same layer as the auxiliary electrode, and the capacitor further includes another electrode plate that is closer to the base substrate than the functional electrode.

For example, a dimension of the second connection part protruding from the first connection part is greater than or equal to a thickness of the first connection part.

For example, the display panel further includes: an insulating layer, the insulating layer is located between the auxiliary electrode and the conductive connection member, and the conductive connection member is connected with the auxiliary electrode through a via hole penetrating the insulating layer.

For example, the insulating layer includes a passivation layer and a planarization layer, the passivation layer is closer to the base substrate than the planarization layer, the via hole includes a first through hole penetrating the passivation layer and a second through hole penetrating the planarization layer, an orthographic projection of the first through hole on the base substrate falls within an orthographic projection of the second through hole on the base substrate, and an orthographic projection of the first through hole on the base substrate falls within the orthographic projection of the auxiliary electrode on the base substrate.

For example, the insulating layer includes a slope part for forming the via hole, and an orthographic projection of the separation structure on the base substrate is located within an orthographic projection of the slope part on the base substrate.

For example, the insulating layer further includes a flat part, and the first connection electrode extends from the slope part to the flat part.

For example, a slope angle of the slope part is in a range from 15 degrees to 45 degrees.

For example, a dimension of the slope part in a radial direction of the via hole is greater than a space between the slope part and the auxiliary electrode in the radial direction of the via hole.

For example, the first electrode is divided into a first conductive part and a second conductive part that are spaced apart from each other by the separation structure, an orthographic projection of the first conductive part on a surface of the slope part for forming the via hole is overlapped with an orthographic projection of the second conductive part on the surface of the slope part for forming the via hole.

For example, an overlapping dimension of the orthographic projections of the first conductive part and the second conductive part on the surface of the slope part for forming the via hole is smaller than a dimension of the second connection part protruding from the first connection part.

For example, an overlapping dimension of the orthographic projections of the first conductive part and the second conductive part on the surface of the slope part for forming the via hole is one-third to one-half of the dimension of the second connection part protruding from the first connection part.

For example, a surface of the first connection part close to the base substrate is conformal to a surface of the slope part for forming the via hole.

For example, the light-emitting functional layer is divided into a first light-emitting functional part and a second light-emitting functional part that are spaced apart from each other by the separation structure, an orthographic projection of the first light-emitting functional part on the base substrate is overlapped with an orthographic projection of the auxiliary electrode on the base substrate, and an slope angle of the slope part is larger than an angle between a part of the second light-emitting functional part close to the separation structure and the first connection electrode.

For example, the display panel further includes: a display electrode, the display electrode includes a first display electrode part, a second display electrode part, and a third display electrode part, the first display electrode part is located in a same layer as the first connection electrode, the second display electrode part is located in a same layer as the first connection part, the third display electrode part is located in a same layer as the second connection part, and a dimension of the first display electrode part protruding from the second display electrode part is smaller than a dimension of the first connection electrode protruding from the first connection part.

For example, the pixel defining pattern further includes a second opening, the second opening exposes at least a part of the display electrode, the pixel defining pattern further includes a third defining structure surrounding the second opening, the third defining structure covers an end of the display electrode, and the first electrode is continuous at the second opening.

For example, a contact surface between the slope part and the first connection electrode includes a smooth curved surface.

For example, the groove includes an over-etching hole.

Embodiment of the present disclosure further provide a display device, including any one of the display panels as described above.

Embodiment of the present disclosure further provide a manufacturing method of a display panel, including: providing a base substrate; forming an auxiliary electrode on the base substrate; forming a conductive connection member on the auxiliary electrode, the conductive connection member including a separation structure; forming a light-emitting functional layer on the conductive connection member, the light-emitting functional layer being disconnected at the separation structure; and forming a first electrode on the light-emitting functional layer; the first electrode is connected with the conductive connection member at the separation structure, the first electrode is connected with the auxiliary electrode through the conductive connection member, the separation structure includes a groove, and an angle between an orientation of the groove and the base substrate is an acute angle.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Figure 1:
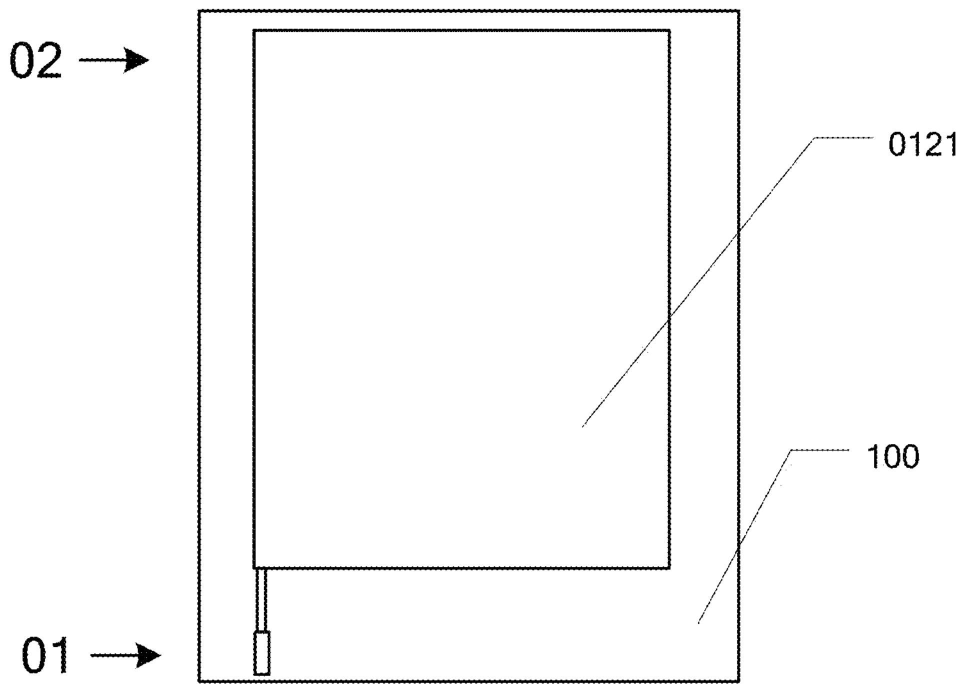
FIG. 1 is a schematic diagram of a display panel.

FIG. 1 is a schematic diagram of a display panel. As illustrated in FIG. 1, a cathode 0121 is arranged on the base substrate 100, and the cathode 0121 is basically arranged on the entire surface of the base substrate 100. For example, a cathode of a top-emitting organic light-emitting diode (OLED) panel may be a semi-reflective and semi-translucent cathode, the material of the cathode includes, for example, Mg/Ag etc. However, the semi-reflective and semi-translucent cathode has a high resistance, which has a more obvious voltage drop (IR drop) effect and higher power consumption. Due to the voltage drop (IR drop) of the cathode, it is easy to appear that brightness of a voltage input starting end 01 is relatively high, brightness of a voltage input terminal end 02 is low, and the brightness is uneven, and the voltage input terminal end 02 has a color shift phenomenon. For example, in FIG. 1, a lower side of the display panel is an IC bonding end (the starting end 01), an upper end is an IC opposite end (the terminal end 02). The starting end 01 is a drive circuit (integrated circuit, IC) bonding end, the terminal end 02 is an opposite end of IC, which is the other end opposite to the IC bonding end. For a medium and large-sized top-emitting OLED products, the problem of uneven display brightness is more prominent.

In order to reduce the voltage drop, an auxiliary electrode can be made to reduce the resistance of the cathode. In order to connect the cathode and the auxiliary electrode, additional processes are usually required, and the manufacturing process is cumbersome.

At least one embodiment of the present disclosure provides a display panel, a manufacturing method thereof, and a display device. The display panel includes a base substrate and a conductive connection member located on the base substrate, the conductive connection member includes a separation structure, the display panel further includes a light-emitting functional layer, a first electrode, and an auxiliary electrode, the light-emitting functional layer is located on a side of the conductive connection member facing away from the base substrate, and is disconnected at the separation structure, the first electrode is located on a side of the light-emitting functional layer facing away from the base substrate, the auxiliary electrode is located on a side of the conductive connection member close to the base substrate, the first electrode is connected with the conductive connection member at the separation structure, and the first electrode is connected with the auxiliary electrode through the conductive connection member.

The display panel provided by the embodiments of the present disclosure is provided with a conductive connection member having a separation structure, to disconnect the light-emitting functional layer, thus the first electrode can be connected with the conductive connection member, so that the first electrode is connected with a lower layer component (the auxiliary electrode) through the conductive connection member, and the display quality is improved by reducing the voltage drop of the first electrode of the display panel.

The display panel, a manufacturing method thereof, and the display device provided by the embodiments of the present disclosure will be described below with reference to the accompanying drawings.

Figure 2:
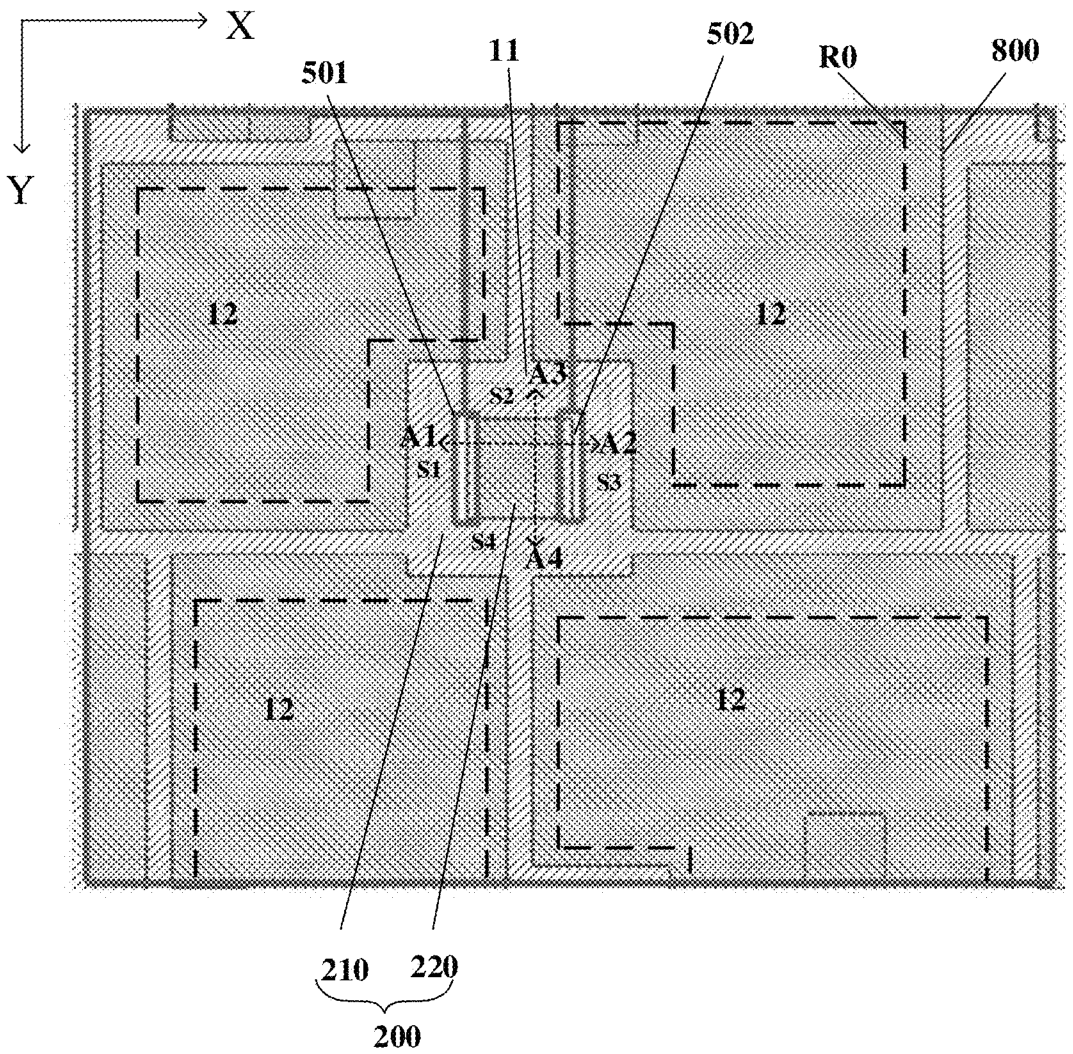
FIG. 2 is a partial plan view of a display panel provided by an embodiment of the present disclosure.
Figure 3:
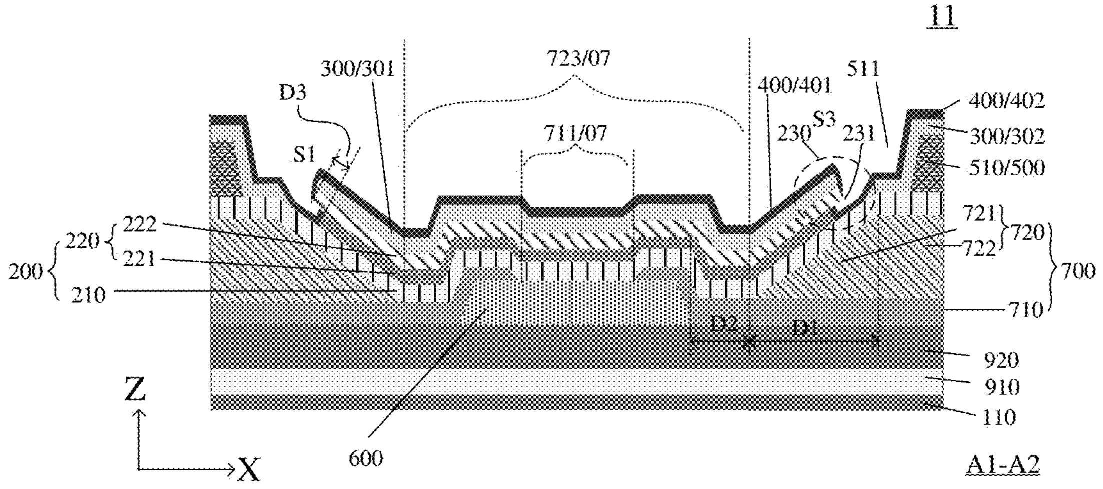
FIG. 3 is a cross-sectional view taken along a line A1-A2 of FIG. 2.
Figure 4:
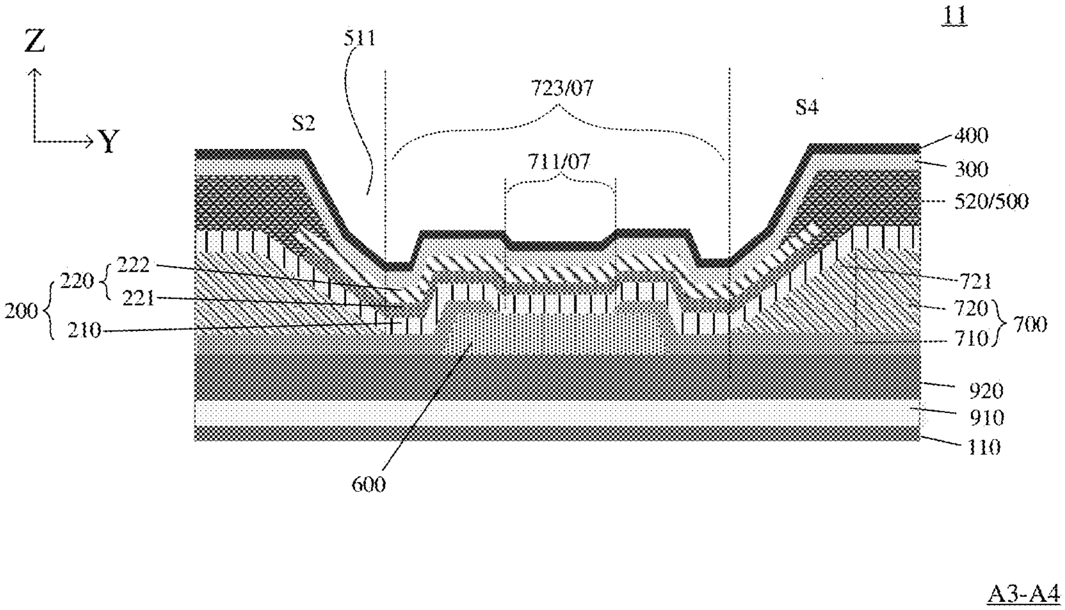
FIG. 4 is a cross-sectional view taken along a line A3-A4 of FIG. 2.
Figure 5:
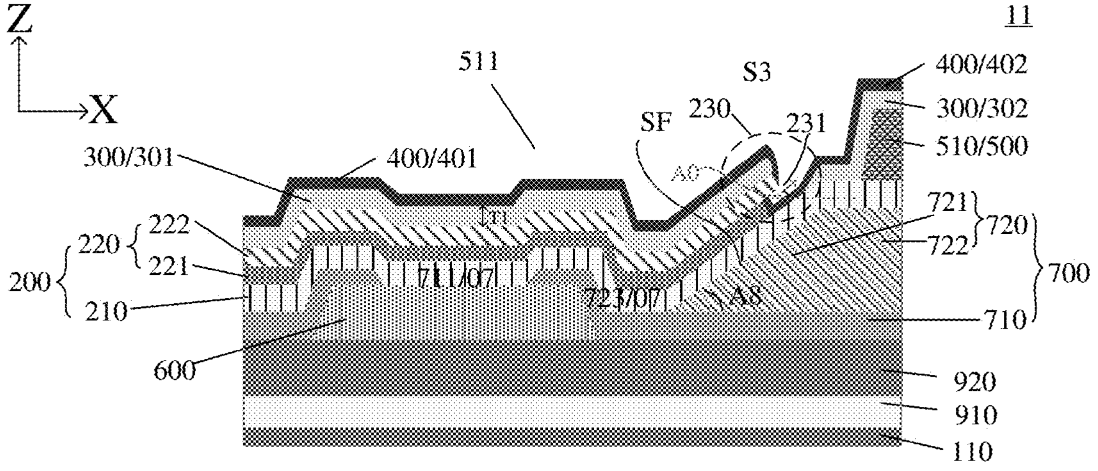
FIG. 5 is a partial cross-sectional view of a display panel provided by an embodiment of the present disclosure.
Figure 6:
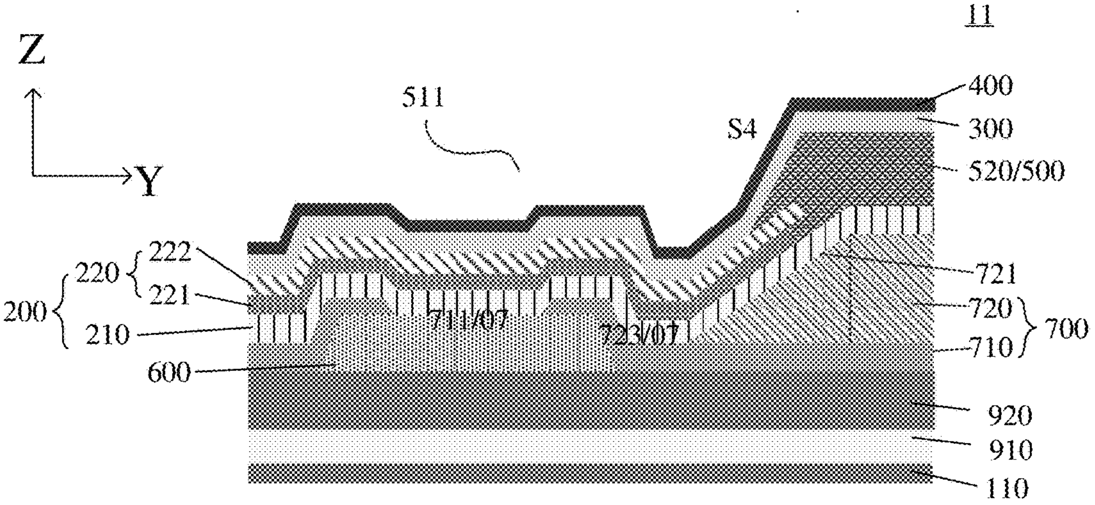
FIG. 6 is a partial cross-sectional view of a display panel provided by an embodiment of the present disclosure.

FIG. 2 is a partial plan view of a display panel provided by an embodiment of the present disclosure. FIG. 3 is a cross-sectional view taken along a line A1-A2 of FIG. 2. FIG. 4 is a cross-sectional view taken along a line A3-A4 of FIG. 2. FIG. 5 is a partial cross-sectional view of a display panel provided by an embodiment of the present disclosure. FIG. 6 is a partial cross-sectional view of a display panel provided by an embodiment of the present disclosure.

As illustrated in FIG. 3 and FIG. 4, the display panel includes a base substrate 110.

As illustrated in FIG. 2 to FIG. 6, the display panel includes a conductive connection member 200, and the conductive connection member 200 includes a separation structure 230.

As illustrated in FIG. 3, the display panel includes a light-emitting functional layer 300 and a first electrode 400, the light-emitting functional layer 300 is located on a side of the conductive connection member 200 facing away from the base substrate 110, and is disconnected at the separation structure 230; the first electrode 400 is located on a side of the light-emitting functional layer 300 facing away from the base substrate 110. The first electrode 400 is connected with the conductive connection member 200 at the separation structure 230.

The display panel provided by the embodiment of the present disclosure is arranged with a conductive connection member having a separation structure, the separation structure can disconnect the light-emitting functional layer, the first electrode is connected with the conductive connection member at the position of the separation structure, the structure is ingeniously designed and easy to manufacture, which is conducive to reducing the resistance of the first electrode and improving the display quality.

As illustrated in FIG. 3, the conductive connection member 200 includes a first connection electrode 210 and a second connection electrode 220. The first connection electrode 210 and the second connection electrode 220 are located in the connection region 11.

As illustrated in FIG. 3 to FIG. 5, the first connection electrode 210 is closer to the base substrate 110 than the second connection electrode 220. As illustrated in FIG. 3, the conductive connection member 200 forms a separation structure 230 at the end of the second connection electrode 220. For example, the separation structure 230 may cause a subsequently formed film layer to be disconnected at the position of the separation structure. FIG. 3 to FIG. 5 are illustrated by taking the separation structure 230 located on an outer edge of the second connection electrode 220 as an example, but not limited to this. In other embodiments, the separation structure may be on an inner edge of the second connection electrode 220 of the conductive connection member 200. For example, the second connection electrode 220 may have a ring structure, in this case, both an inner edge and an outer edge of the ring structure can form the separation structure 230.

As illustrated in FIG. 3 and FIG. 6, the second connection electrode 220 includes a first connection part 221 and a second connection part 222, the first connection part 221 is closer to the base substrate 110 than the second connection part 222, and the first connection part 221 is inwardly recessed than the second connection part 222 on a side of the second connection electrode 220 to form a groove 231, so as to form the separation structure 230. For example, the second connection part 222 protrudes relative to the first connection part 221 to form the separation structure 230. For example, an end of the second connection part 222 protrudes relative to an end of the first connection part 221 to form the separation structure 230.

For example, etching rate of the material of the first connection part 221 is greater than the etching rate of material of the second connection part 222, and the etching rate of the material of the first connection part 221 is greater than etching rate of material of the first connection electrode 210. For example, the groove 231 includes an over-etching hole. The groove 231 can also be called as an inwardly recessed structure.

For example, the material of the first connection part 221 includes metal, the material of the second connection part 222 and the material of the first connection electrode 210 include conductive metal oxide. For example, the metal includes at least one of molybdenum and aluminum, and the conductive metal oxide includes indium tin oxide. In addition, other metal materials can also be used for the first connection part 221, the second connection part 222 may also use other metal oxides, which is not limited in the present disclosure.

In some embodiments of the present disclosure, the first connection part 221 and the second connection part 222 may use different materials, to have different etching rates for the same etching solution, which is conducive to forming the over-etching hole, of course, in other embodiments, the first connection part 221 and the second connection part 222 can also be made of the same material, by adjusting the manufacturing process to form the over-etching hole.

For example, as illustrated in FIG. 3 to FIG. 6, the thickness of the first connection part 221 is greater than the thickness of the second connection part 222, and the thickness of the first connection part 221 is greater than the thickness of the first connection electrode 210. That is, the thickness of the first connection part 221 located in the middle layer is greater than a thickness of the first connection electrode 210 and is also greater than the thickness of the second connection part 222. Of course, the thickness of the first connection part 221, the thickness of the second connection part 222, and the thickness of the first connection electrode 210 are not limited to the above descriptions, which can be set as required, as long as the light-emitting functional layer 300 can be disconnected and a connection between the first electrode 400 and the conductive connection member 200 can be realized.

As illustrated in FIG. 2, the display panel includes a connection region 11 and display regions 12. A plurality of display regions 12 are arranged around one connection region 11. Intervals are arranged between the plurality of display regions 12 and the connection region 11. Intervals are also arranged between the plurality of display regions 12. The conductive connection member 200 is arranged in the connection region 11, and the region other than the connection region 11 may be called as the display regions 12.

Figure 12:
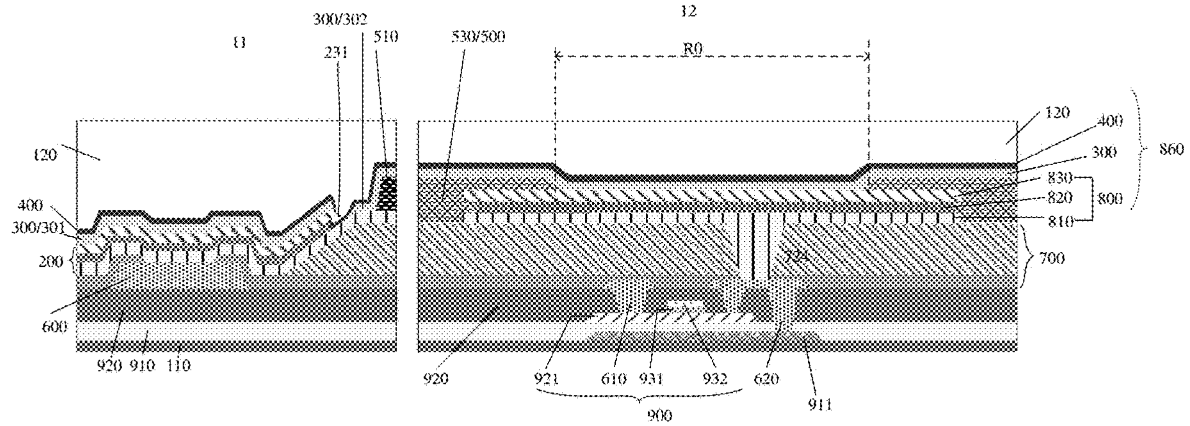
FIG. 12 is a schematic structural diagram of a connection region and a display region in a display panel provided by an embodiment of the present disclosure.
Figure 13:
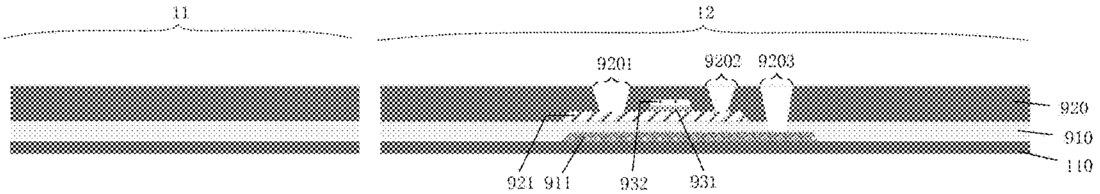
FIG. 13 to FIG. 20 are process flow charts of a manufacturing method of the display panels provided by the embodiments of the present disclosure.
Figure 14:
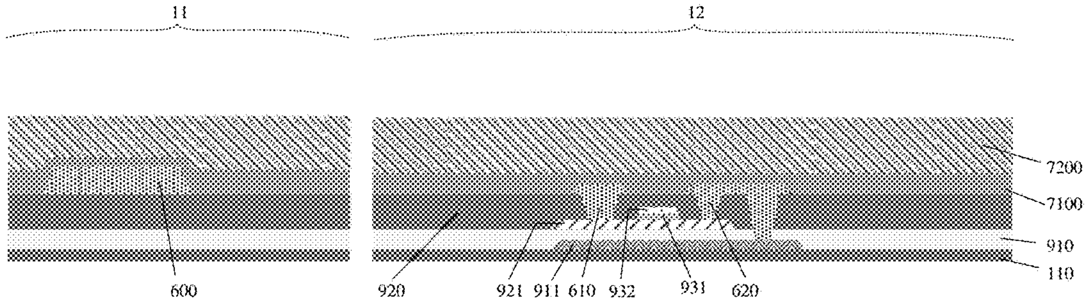

FIG. 2 illustrates a display electrode 800. For example, the first electrode 400, the light-emitting functional layer 300, and the display electrode 800 can constitute a light-emitting element 860 (as illustrated in FIG. 12), the first electrode 400 may be a cathode of the light-emitting element 860, the display electrode 800 may be an anode of the light-emitting element 860, which is not limited to this. For example, the display region 12 may correspond to the light-emitting region R0 of the light-emitting element.

For example, the display panel may be a top-emitting display panel. For example, a top-emitting display panel can be manufactured into a large-sized display panel.

As illustrated in FIG. 2, a shape of the second connection electrode 220 is a rectangle, including a first side S1, a second side S2, a third side S3, and a fourth side S4, the first side S1 and the third side S3 are arranged oppositely, the second side S2 and the fourth side S4 are arranged oppositely, and the first side S1, the second side S2, the third side S3, and the fourth side S4 are connected in sequence. For example, the first side S1, the second side S2, the third side S3, and the fourth side S4 may be referred to as a left side, an upper side, a right side, and a lower side, respectively.

As illustrated in FIG. 3 and FIG. 4, the display panel further includes a pixel defining pattern 500, the pixel defining pattern 500 is arranged between the light-emitting functional layer 300 and the first connection electrode 210, the pixel defining pattern 500 includes a first opening 511, the first opening 511 exposes the separation structure 230 of the second connection electrode 220 on at least one side of the second connection electrode 220. For example, the first opening 511 exposes at least a part of the edges of the second connection electrode 220. As illustrated in FIG. 3, the first opening 511 may also expose at least a part of the first connection electrode 210, the first electrode 400 is connected with the exposed part of the first connection electrode 210 after being disconnected by the separation structure 230.

For example, as illustrated in FIG. 3, in order to facilitate an overlap-contact of the first electrode 400 and the conductive connection member 200, the first opening 511 exposes the separation structure 230, an orthographic projection of the first opening 511 on the base substrate 110 is not overlapped with an orthographic projection of a part of the second connection electrode 220 located at the position of the separation structure 230 on the base substrate 110.

For example, as illustrated in FIG. 2 and FIG. 3, an orthographic projection of the first opening 511 on the base substrate 110 is at least partially overlapped with an orthographic projection of the separation structure 230 located on an edge of the second connection electrode 220 on the base substrate 110. For example, the edge of the second connection electrode 220 refers to a boundary of the second connection electrode 220.

For example, as illustrated in FIG. 3, the pixel defining pattern 500 further includes a first defining structure 510 forming at least a part of the first opening 511, an orthographic projection of the first defining structure 510 on the base substrate 110 is not overlapped with an orthographic projection of the separation structure 230 of the second connection electrode 220 on the base substrate 110, to expose at least a part of the separation structure 230 of the second connection electrode 220, an interval is provided between the first defining structure 510 and the second connection electrode 220, and is located outside at least a part of an edge of the second connection electrode 220. For example, the first defining structure 510 is located on at least one side of the first opening 511. As illustrated in FIG. 3 and FIG. 4, the first opening 511 exposes at least a part of the separation structure 230. As illustrated in FIG. 2, the separation structure 230 of the second connection electrode 220 is in a closed shape at a boundary of the second connection electrode 220, FIG. 2 is illustrated as a rectangle. As illustrated in FIG. 3 and FIG. 4, at the same first opening 511, a part of the edge of the separation structure 230 is exposed, and another part of the edge of the separation structure 230 is not exposed.

For example, as illustrated in FIG. 3, at least one side of an end of the second connection electrode 220 is exposed by the first opening 511, and when forming the first electrode 400, the first electrode 400 may be disconnected by the separation structure 230, the first electrode 400 may be in contact with at least one of a surface of the first connection electrode 210 facing away from the base substrate and a side surface of the second connection electrode 220, so as to facilitate a connection between the first electrode 400 and the conductive connection member 200, thereby reducing contact resistance.

As illustrated in FIG. 3, the contact between the first electrode 400 and the side surface of the second connection electrode 220 includes at least one of the first electrode 400 in contact with the side surface of the first connection part 221 and the first electrode 400 in contact with the side surface of the second connection part 222.

For example, as illustrated in FIG. 3, in some embodiments, a contact area of the first electrode 400 and the surface of the first connection electrode 210 facing away from the base substrate is larger than a contact area of the first electrode 400 and the side surface of the first connection part 221, and is larger than a contact area between the first electrode 400 and the side surface of the second connection part 222. Therefore, contact reliability between the first electrode 400 and the surface of the first connection electrode 210 facing away from the base substrate is greater than contact reliability between the first electrode 400 and the side surface of the first connection part 221, and is greater than contact reliability between the first electrode 400 and the side surface of the second connection part 222.

For example, in the second connection electrode 220, the thickness of the first connection part 221 is greater than the thickness of the second connection part 222, and the contact area of the first electrode 400 and the side surface of the first connection part 221 is larger than the contact area of the first electrode 400 and the side surface of the second connection part 222.

For example, in some embodiments, the contact reliability of the first electrode 400 and the side surface of the second connection part 222 is greater than the contact reliability of the first electrode 400 and the side surface of the first connection part 221. For example, the better the contact reliability, the more stable the connection of the components.

As illustrated in FIG. 4, the pixel defining pattern 500 further includes a second defining structure 520 forming at least a part of the first opening 511, the second defining structure 520 covers the separation structure 230 on at least one side of the second connection electrode 220. For example, the second defining structure 520 covers at least a part of the edge of the second connection electrode 220, the second defining structure 520 is located on at least one side of the first opening 511. In this way, in a case that the light-emitting functional layer 300 and the first electrode 400 extend from the pixel defining pattern 500 to above the auxiliary electrode 600, the light-emitting functional layer 300 and the first electrode 400 can remain continuous, respectively. Therefore, the part of the first electrode located in the connection region 11 and the part of the first electrode located in the display region 12 can still be an integral pattern connected with each other, to improve a final lapping effect.

FIG. 2 illustrates a rectangular frame 501 and a rectangular frame 502, the two rectangular frames are at the positions where the light-emitting functional layer 300 is disconnected by the separation structure 230.

As illustrated in FIG. 3 and FIG. 4, a buffer layer 910 and an insulating layer 920 are sequentially arranged on the base substrate 110.

As illustrated in FIG. 3, the display panel further includes an auxiliary electrode 600, the auxiliary electrode 600 is located on a side of the conductive connection member 200 close to the base substrate 110; and the first electrode 400 is connected with the auxiliary electrode 600 through the conductive connection member 200. The auxiliary electrode 600 is connected in parallel with the first electrode 400 through the conductive connection member 200, to reduce the resistance of the first electrode 400.

As illustrated in FIG. 3, the insulating layer 700 includes a via hole 07, the insulating layer 700 is located between the auxiliary electrode 600 and the conductive connection member 200, and the conductive connection member 200 is connected with the auxiliary electrode 600 through the via hole 07 penetrating the insulating layer 700.

As illustrated in FIG. 3, the auxiliary electrode 600 is arranged on the insulating layer 920. An insulating layer 700 and a conductive connection member 200 are sequentially arranged on the auxiliary electrode 600.

Referring to FIG. 2 and FIG. 3, the rectangular frame 501 indicates that the light-emitting functional layer 300 is disconnected by the separation structure 230 on the first side S1, the first electrode 400 is connected with the conductive connection member 200 at the first side S1, the rectangular frame 502 indicates that the light-emitting functional layer 300 is disconnected by the separation structure 230 on the third side S3, and the first electrode 400 is connected with the conductive connection member 200 at the third side S3.

Referring to FIG. 2 and FIG. 4, the light-emitting functional layer 300 is not disconnected by the separation structure 230 on the second side S2 and the fourth side S4, and the first electrode 400 is continuous on both the second side S2 and the fourth side S4.

Referring to FIG. 2 to FIG. 4, the light-emitting functional layer 300 is disconnected by the separation structure 230 on two sides of the second connection electrode 220 in the first direction X, and the two sides of the second connection electrode 220 in the second direction Y are not separated by the separation structure 230 as an example for illustration.

For example, as illustrated in FIG. 3, the orthographic projection of the first connection electrode 210 on the base substrate 110 is greater than the orthographic projection of the second connection electrode 220 on the base substrate 110. In this way, the first electrode 400 can be connected with a surface of the first connection electrode 210 facing away from the base substrate, to improve reliability of the connection between the first electrode 400 and the conductive connection member 200.

For example, as illustrated in FIG. 3, the first electrode 400 is sequentially in contact with the side surface of the light-emitting functional layer 300, the side surface of the second connection electrode 220, and the surface of the first connection electrode 210 facing away from the base substrate 110 from top to bottom. In this way, the first electrode 400 is connected with the auxiliary electrode 600 through the conductive connection member 200. In addition, the first electrode 400 may only be in contact with at least one of the side surface of the light-emitting functional layer 300, the side surface of the second connection electrode 220, and the surface of the first connection electrode 210 facing away from the base substrate 110.

As illustrated in FIG. 3 to FIG. 6, the insulating layer 700 includes a passivation layer 710 and a planarization layer 720, the passivation layer 710 is closer to the base substrate 110 than the planarization layer 720.

For example, as illustrated in FIG. 3 and FIG. 4, the via hole 07 includes a first through hole 711 penetrating the passivation layer 710 and a second through hole 723 penetrating the planarization layer 720, an orthographic projection of the first through hole 711 on the base substrate falls within an orthographic projection of the second through hole 723 on the base substrate 110, and the orthographic projection of the first through hole 711 on the base substrate 110 falls within an orthographic projection of the auxiliary electrode 600 on the base substrate. In this way, the conductive connection member 200 above the auxiliary electrode 600 can be connected with the auxiliary electrode 600 through the via hole 07 (the first through hole 711 and the second through hole 723).

For example, as illustrated in FIG. 3 and FIG. 4, the insulating layer 700 includes a slope part 721 forming the via hole 07, an orthographic projection of the separation structure 230 on the base substrate is located within an orthographic projection of the slope part 721 on the base substrate. For example, the separation structure 230 is located at the slope part 721. As illustrated in FIG. 3, the separation structure 230 is arranged on the slope part 721, which is more conducive to the entry of the first electrode 400 into the separation structure 230, so as to be electrically connected with the second connection electrode 220. That is, the separation structure 230 located at the slope part 721 is more conducive to the contact between the first electrode 400 and the side surface of the second connection electrode 220.

For example, as illustrated in FIG. 3 and FIG. 4, the via hole 07 includes a first through hole 711 and a second through hole 723. A slope angle A8 of the slope part 721 ranges from 15 degrees to 45 degrees. For example, the slope angle of the slope part 721 may range from 20 degrees to 40 degrees. For example, the slope angle may range from 25 degrees to 35 degrees. Further for example, the slope angle may range from 30 degrees to 35 degrees.

For example, the slope angle A8 refers to an included angle of the part of the slope part 721 close to the via hole 07. For example, the slope angle A8 is an angle between the surface SF of the slope part 721 for forming the via hole 07 (the second through hole 723) and the base substrate BS.

As illustrated in FIG. 3 and FIG. 4, the insulating layer 700 further includes a flat part 722, the first connection electrode 210 extends from the slope part 721 to the flat part 722. In addition, in the embodiments illustrated in FIG. 3 and FIG. 4, the separation structure 230 is located on the slope part 721, but the separation structure 230 can also be located on the flat part 722.

In the connection region 11 of the display panel provided by at least some embodiments of the present disclosure, the shape of the pixel defining pattern 500 can be changed in any combination of the first defining structure 510 and the second defining structure 520. For example, the first defining structure 510 or the second defining structure 520 is arranged on any side or multiple sides of the first opening 511, or both the first defining structure 510 and the second defining structure 520 are arranged on any side or multiple sides of the first opening 511; in addition, the size and the shape of the first opening 511 may also vary, for example, triangle, pentagon, circle and so on. These changes are not intended to limit the embodiments of the present disclosure. In practical applications, the following various schemes can be adopted according to the actual space and the overlap-contact effect.

FIG. 5 and FIG. 6 are only the structure of the display panel provided by some embodiments of the present disclosure, and the embodiments of the present disclosure include but are not limited to this.

Figure 7:
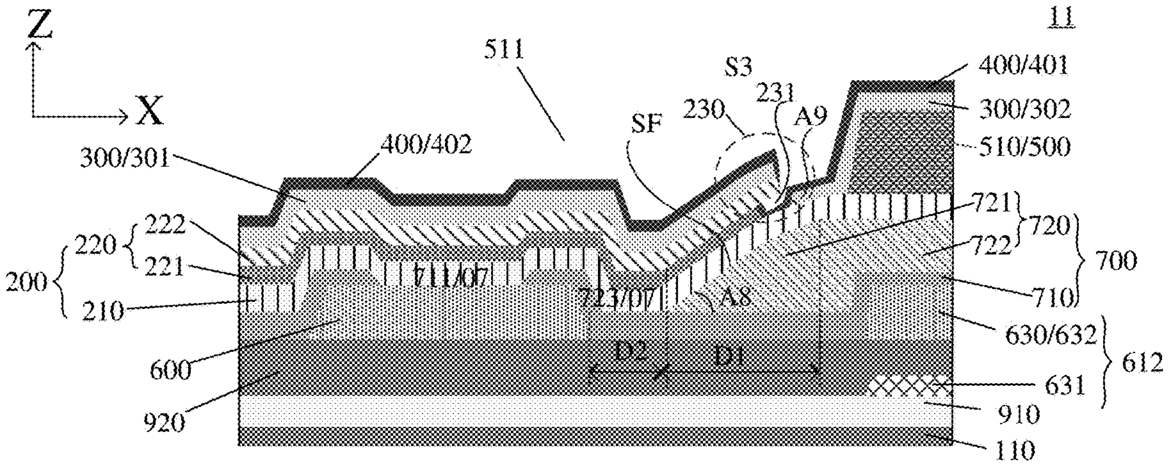
FIG. 7 is a partial cross-sectional view of a display panel provided by an embodiment of the present disclosure.
Figure 8:
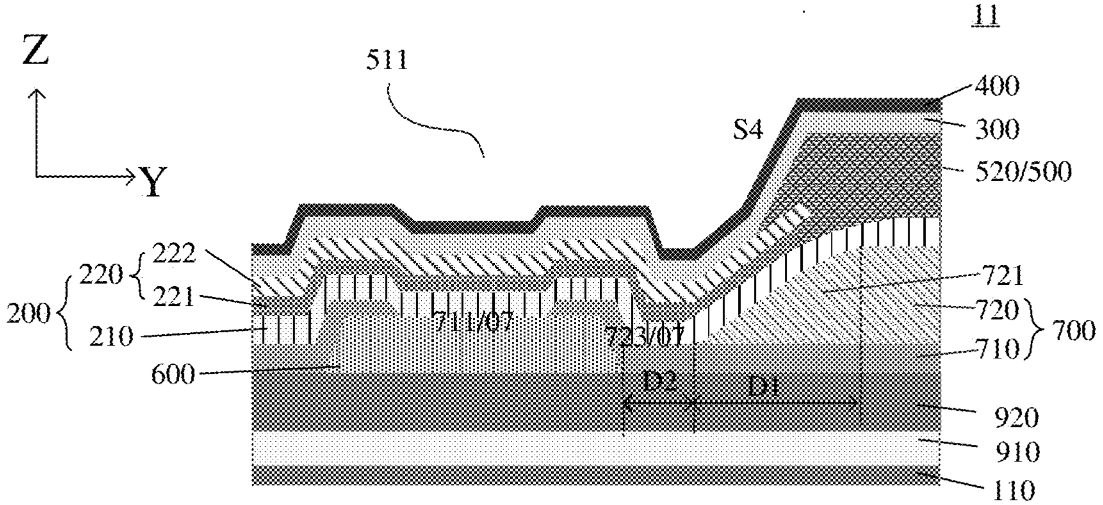
FIG. 8 is a partial cross-sectional view of a display panel provided by an embodiment of the present disclosure.

FIG. 7 is a partial cross-sectional view of a display panel provided by an embodiment of the present disclosure. FIG. 8 is a partial cross-sectional view of a display panel provided by an embodiment of the present disclosure.

As illustrated in FIG. 7 and FIG. 8, a surface of the slope part 721 is a smooth curved surface or an arc surface. A form of the surface of the slope part 721 can be determined according to requirements. A contact surface between the slope part 721 and the first connection electrode 210 includes a smooth curved surface. In a case that the surface of the slope part 721 is a plane, the surface of the structure conforming to the slope part 721 is parallel to the plane. In a case that the surface of the slope part 721 is a curved surface, the surface of the structure conforming to the slope part 721 is also a curved surface.

For example, in a case that the surface of the slope part 721 is a smooth curved surface or an arc surface, the slope angle A8 may be an angle between a tangent line of a point on the surface of the slope part 721 and a bottom surface of the slope part 721. For included angles of other curved surfaces or arc surfaces, reference may be made to the above descriptions.

As illustrated in FIG. 3 to FIG. 8, in order to form a gentle slope, a dimension D1 of the slope part 721 in the radial direction of the via hole 07 is greater than a space D2 between the slope part 721 and the auxiliary electrode 600 in the radial direction of the via hole 07. For example, the dimension D1 is greater than or equal to twice the space D2. For example, the dimension D1 is less than or equal to five times the space D2.

For example, a radial direction of a via hole/a through hole refers to a direction from a center of the via hole/the through hole to the edge of the via hole/the through hole, and is not limited to the shape of the via hole/through hole being circular. The shape of the via hole/the through hole can be determined as required.

As illustrated in FIG. 3, FIG. 5, and FIG. 7, in the separation structure 230, a dimension D3 of the second connection part 222 protruding from the first connection part 221 is greater than or equal to a thickness of the first connection part 221. The dimension D3 of the second connection part 222 protruding from the first connection part 221 may also be referred to as the dimension D3 of the first connection part 221 being inwardly recessed relative to the second connection part 222.

For example, in the embodiments of the present disclosure, a thickness of a component refers to a dimension of the component in a direction perpendicular to its manufacture surface. For example, the thickness of the first connection part 221 refers to the thickness of the first connection part 221 on a surface perpendicular to the first connection electrode 210.

As illustrated in FIG. 3 to FIG. 8, the conductive connection member 200 is in contact with both the slope part 721 and the flat part 722 of the planarization layer 720.

FIG. 3 illustrates that the light-emitting functional layer 300 includes a first light-emitting functional part 301 and a second light-emitting functional part 302 that are spaced apart from each other.

As illustrated in FIG. 3, FIG. 5 and FIG. 7, the separation structure 230 includes a groove 231, an angle between the orientation of the groove 231 and the base substrate BS is an acute angle. The orientation of the groove 231 may refer to a direction from the bottom surface of the groove 231 to the opening of the groove. FIG. 5 illustrates the orientation of the groove 231 with an arrow. FIG. 5 also illustrates the angle A0 between the orientation of the groove 231 and the base substrate BS.

In the display panel provided by the embodiments of the present disclosure, the angle between the orientation of the groove 231 and the base substrate BS is an acute angle, which facilitates the connection between the first electrode 400 and the conductive connection member 200. For example, the angle between the orientation of the groove 231 and the base substrate BS is an acute angle, which facilitates the connection between the first electrode 400 and at least one of the first connection electrode 210, the first connection part 221, and the second connection part 222 in the conductive connection member 200.

For example, the included angle A0 is greater than or equal to 30 degrees and less than or equal to 60 degrees. Further for example, the included angle A0 is greater than or equal to 35 degrees and less than or equal to 55 degrees.

In the embodiments of the present disclosure, an angle between a component and the base substrate BS refers to an angle between the component and the main surface of the base substrate BS. The surface of the base substrate BS used for manufacturing various components is the main surface. In the sectional diagram, the upper surface of the base substrate BS is the main surface.

For example, as illustrated in FIG. 3, FIG. 5, and FIG. 7, in order to facilitate the disconnection of the light-emitting functional layer 300, the dimension D3 (as illustrated in FIG. 3) of the second connection part 222 protruding from the first connection part 221 is greater than the thickness of the light-emitting functional layer 300. For example, the thickness of the light-emitting functional layer 300 refers to a film thickness of the light-emitting functional layer 300. FIG. 5 illustrates the thickness Tl of the light-emitting functional layer 300. For example, the thickness of the light-emitting functional layer 300 can be equal at various positions. That is, the light-emitting functional layer 300 may have substantially the same film thickness at various positions.

For example, as illustrated in FIG. 3, FIG. 5, and FIG. 7, due to the inclined orientation of the groove 231 or the inclined arrangement of the groove 231, the length of the contact part between the first electrode 400 and the first connection electrode 210 is greater than the dimension D3 of the second connection part 222 protruding from the first connection part 221 (as illustrated in FIG. 3).

For example, as illustrated in FIG. 7, the display panel further includes a functional electrode 630, the functional electrode 630 is adjacent to the auxiliary electrode 600, an orthographic projection of the functional electrode 630 on the base substrate BS is not overlapped with the orthographic projection of the auxiliary electrode 600 on the base substrate BS, in order to make the separation structure 230 formed on a substantially flat surface, so that the interface is smooth to improve the connection stability between the first electrode and the conductive connection member, and the orthographic projection of the separation structure 230 on the base substrate BS is not overlapped with the orthographic projection of the functional electrode 630 on the base substrate BS.

For example, as illustrated in FIG. 7, the functional electrode 630 is an electrode plate of the capacitor 612, the functional electrode 630 is located in the same layer as the auxiliary electrode 600. The capacitor 612 further includes another electrode plate that is closer to the base substrate BS than the functional electrode 630. FIG. 7 illustrates the electrode plate 631 and the electrode plate 632 of the capacitor 612. The functional electrode 630 can also be other structures than the plate electrode of the capacitor.

For example, as illustrated in FIG. 3, FIG. 5, and FIG. 7, the first electrode 400 is divided into a first conductive part 401 and a second conductive part 402 that are spaced apart from each other by the separation structure 230, the orthographic projection of the first conductive part 401 on the surface SF of the slope part 721 for forming the via hole 07 (the second through hole 723) is overlapped with the orthographic projection of the second conductive part 402 on the surface of the slope part for forming the via hole 07 (the second through hole 723). FIG. 7 illustrates the first conductive part 401 is located on the surface SF of the slope part 721 for forming the via hole 07 (the second through hole 723).

For example, as illustrated in FIG. 3, FIG. 5, and FIG. 7, an overlapping dimension of the orthographic projection of the first conductive part 401 on the surface SF of the slope part 721 for forming the via hole 07 (the second through hole 723) and the orthographic projection of the second conductive part 402 on the surface of the slope part for forming the via hole 07 (the second through hole 723) does not exceed the dimension D3 of the second connection part 222 protruding from the first connection part 221 (as illustrated in FIG. 3).

For example, as illustrated in FIG. 3, FIG. 5, and FIG. 7, an overlapping dimension of the orthographic projection of the first conductive part 401 on the surface SF of the slope part 721 for forming the via hole 07 (the second through hole 723) and the orthographic projection of the second conductive part 402 on the surface of the slope part for forming the via hole 07 (the second through hole 723) does not exceed one-third to one-half of the dimension D3 (as illustrated in FIG. 3) of the second connection part 222 protruding from the first connection part 221.

For example, as illustrated in FIG. 3, FIG. 5, and FIG. 7, the overlapping dimension of the orthographic projection of the first conductive part 401 and the orthographic projection of the second conductive part 402 on the surface of the slope part 721 for forming the via hole 07 (the second through hole 723) is smaller than the dimension of the second connection part 222 protruding from the first connection part 221.

For example, the overlapping dimension of the orthographic projection of the first conductive part 401 and the orthographic projection of the second conductive part 402 on the surface of the slope part for forming the via hole 07 (the second through hole 723) is one-third to one-half of the dimension of the second connection part 222 protruding from the first connection part 221.

For example, as illustrated in FIG. 3 to FIG. 8, the surface of the first connection part 221 close to the base substrate BS is conformal to the surface of the slope part 721 for forming the via hole 07 (the second through hole 723). Thus, the first connection part 221 is conformal to the surface of the slope part 721 for forming the via hole 07 (the second through hole 723). For example, the groove 231 may be formed by over-etching, before forming the groove 231, at the slope part 721, the thin film for forming the first connection electrode 210 is conformal to the surface of the slope part 721 for forming the via hole 07 (the second through hole 723), a thin film for forming the first connection part 221 and a thin film for forming the second connection part 222 are conformal to the first connection electrode 210, so as to be conformal to the surface of the slope part 721 for forming the via hole 07 (second through hole 723).

For example, as illustrated in FIG. 3, FIG. 5, and FIG. 7, in order to facilitate the connection between the first electrode 400 and the conductive connection member 200, the light-emitting functional layer 300 is divided into a first light-emitting functional part 301 and a second light-emitting functional part 302 that are separated from each other by the separation structure 230, an orthographic projection of the first light-emitting functional part 301 on the base substrate BS is overlapped with an orthographic projection of the auxiliary electrode 600 on the base substrate BS, and the slope angle A8 of the slope part 721 is larger than the angle A9 between a part of the second light-emitting functional part 302 close to the separation structure 230 and the first connection electrode 210. FIG. 7 illustrates the slope angle A8 of the slope part 721 and the angle A9 between the part of the second light-emitting functional part 302 close to the separation structure 230 and the first connection electrode 210.

FIG. 9A to FIG. 10B are plan views of connection regions 11 in other four display panels provided by the embodiments of the present disclosure.

FIG. 9A to FIG. 10B illustrate plan views of the auxiliary electrode 600, the passivation layer 710, the planarization layer 720, the first connection electrode 210, the second connection electrode 220 and the pixel defining pattern 500. Referring to FIG. 3, FIG. 4, and FIG. 9A to FIG. 10B, the passivation layer 710 is illustrated as a first through hole therein, inside the closed figure is the first through hole, outside the closed figure is the body of the passivation layer, the planarization layer 720 is illustrated as a second through hole located therein, inside the closed figure is the second through hole, and outside the closed figure is the body of the planarization layer. The first through hole 711 penetrating the passivation layer 710 exposes the auxiliary electrode 600, the second through hole 723 penetrating the planarization layer exposes the auxiliary electrode 600 and the first through hole 711 in the passivation layer 710. The difference between FIG. 9A to FIG. 10B is that the first defining structure 510 or the second defining structure 520 of the pixel defining pattern 500 for forming at least a part of the first opening 511 may be arranged in different directions.

Figure 9A:
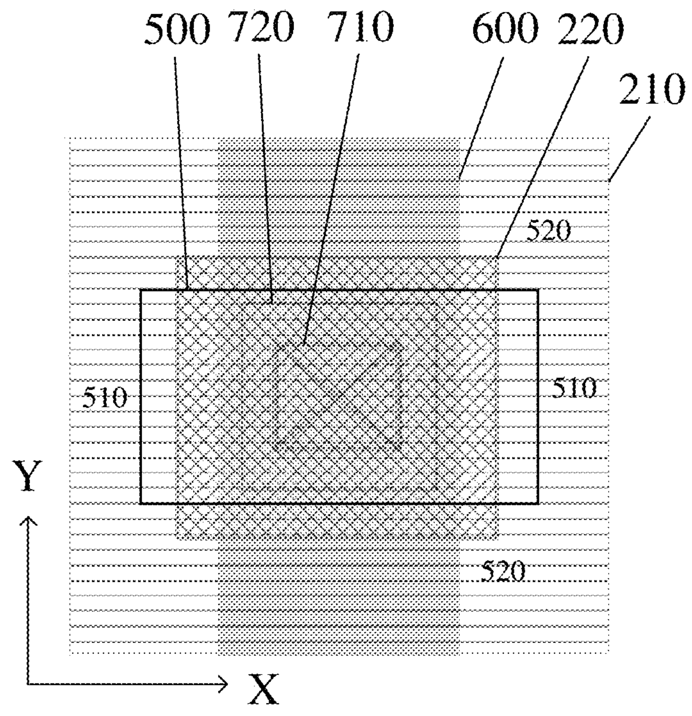
FIG. 9A to FIG. 9B and FIG. 10A to FIG. 10B are plan views of connection regions in other four display panels provided by embodiments of the present disclosure.

For example, as illustrated in FIG. 3, FIG. 4 and FIG. 9A, the first defining structure 510 is arranged on the left side and the right side of the second connection electrode 220, so that the light-emitting functional layer 300 is disconnected by the separation structure 230 of the second connection electrode 220 on the left side and the right side of the second connection electrode 220, so that the first electrode 400 is connected with the conductive connection member 200; and the second defining structure 520 is arranged on the upper side and the lower side of the second connection electrode 220, that is, the second defining structure 520 covers the upper side and the lower side of the second connection electrode 220, so that the light-emitting functional layer 300 is not disconnected by the separation structure 230 of the second connection electrode 220 on the upper side and the lower side, furthermore, the first electrode 400 is continuous at the upper side and the lower side of the second connection electrode 220. In this way, the part of the first electrode 400 located in the connection region 11 and the part of the first electrode 400 located in the display region 12 are still connected with each other as an integrated pattern, so that the final connection effect is improved. In this case, the left side and the right side of the first electrode 400 may be disconnected by the separation structure 230 of the second connection electrode 220, or may be continuous.

Figure 9B:
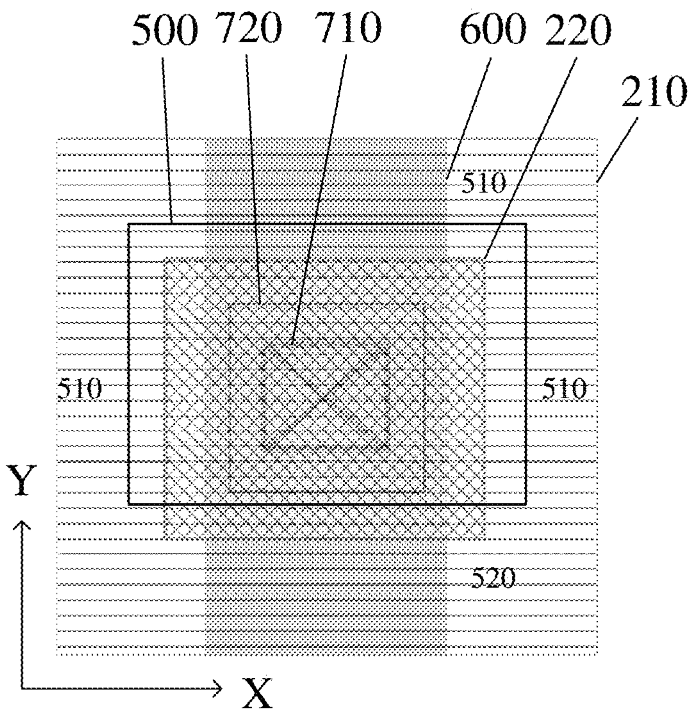

For example, as illustrated in FIG. 3, FIG. 4 and FIG. 9B, the first defining structure 510 is arranged on the left side, the right side and the upper side of the second connection electrode 220, so that the parts of the light-emitting functional layer 300 on the left side, the right side, and the upper side of the second connection electrode 220 are disconnected by the separation structure 230 of the second connection electrode 220, and the first electrode 400 is connected with the conductive connection member 200; while the second defining structure 520 is only arranged on the lower side of the second connection electrode 220, that is, the second defining structure 520 covers the lower side of the second connection electrode 220, so that the lower part of the first electrode 400 is not disconnected by the separation structure 230 of the second connection electrode 220. In this way, the part of the first electrode 400 located in the connection region 11 and the part of the first electrode 400 located in the display region 12 are still connected with each other as an integrated pattern, so that the final connection effect is improved.

Figure 10A:
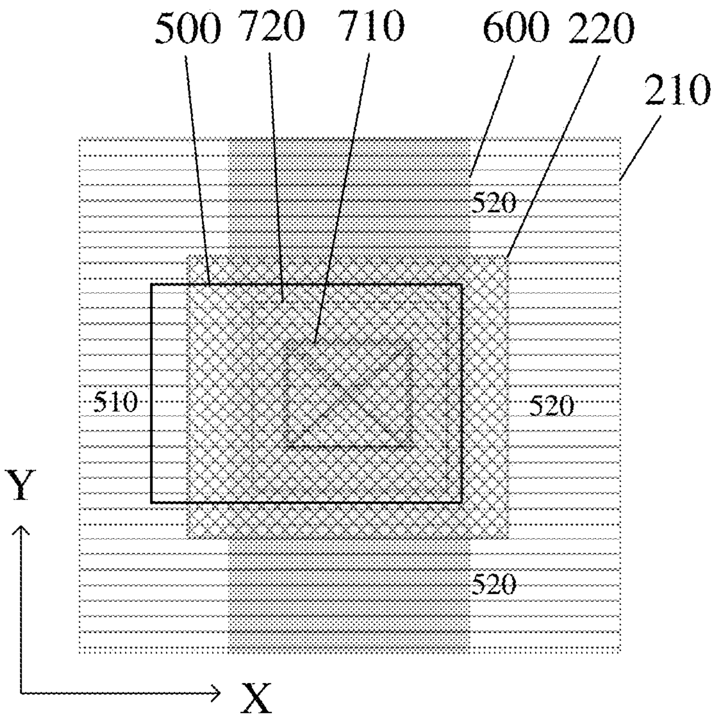

For example, as illustrated in FIG. 3, FIG. 4 and FIG. 10A, the first defining structure 510 is only arranged on the left side of the second connection electrode 220, so that the light-emitting functional layer 300 is disconnected by the separation structure 230 of the second connection electrode 220 on the left side of the second connection electrode 220, and thus the first electrode 400 is connected with the conductive connection member 200; while the second defining structure 520 is arranged on the upper side, the lower side, and the right side of the second connection electrode 220, that is, the second defining structure 520 covers the upper side, the lower side and the right side of the second connection electrode 220, so that the parts of the light-emitting functional layer 300 and the parts of the first electrode 400 located on the upper side, the lower side, and the right side of the second connection electrode 220 are not disconnected by the separation structure 230 of the second connection electrode 220. In this way, the part of the first electrode 400 in the connection region 11 and the part of the first electrode 400 in the display region are still interconnected as an integrated pattern, so that the final connection effect is improved.

Figure 10B:
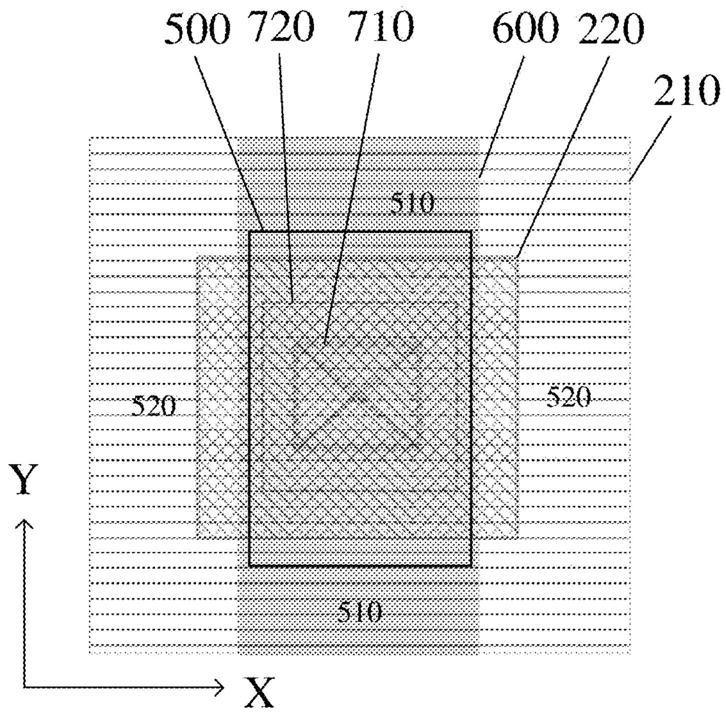

For example, as illustrated in FIG. 3, FIG. 4 and FIG. 10B, the first defining structure 510 is only arranged on the upper side and the lower side of the second connection electrode 220, so that the parts of the light-emitting functional layer 300 located on the upper side and the lower side of the second connection electrode 220 are disconnected by the separation structure 230 of the second connection electrode 220; while the second defining structure 520 is arranged on the left side and the right side of the second connection electrode 220, that is, the second defining structure 520 covers the left side and the right side of the second connection electrode 220, so that the parts of the first electrode 400 located on the left side and the right side of the second connection electrode 220 are not disconnected by the second connection electrode 220. In this way, the part of the first electrode 400 in the connection region 11 and the part of the first electrode 400 in the display region are still interconnected as an integrated pattern, so that the final connection effect is improved.

Figure 11:
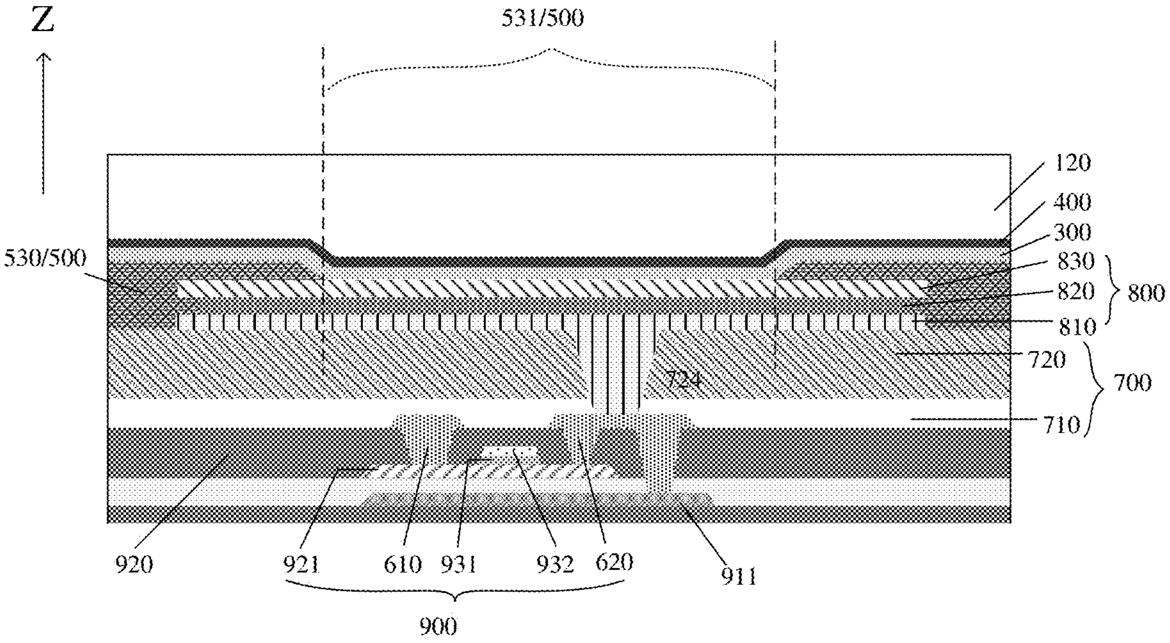
FIG. 11 is a schematic structural diagram of a display region in a display panel provided by an embodiment of the present disclosure.

FIG. 11 is a schematic structural diagram of a display region in a display panel provided by an embodiment of the present disclosure. FIG. 12 is a schematic structural diagram of a connection region and a display region in a display panel provided by an embodiment of the present disclosure.

As illustrated in FIG. 11 and FIG. 12, the display panel further includes a thin film transistor 900 and a display electrode 800. The thin film transistor 900 is arranged on the base substrate 110, and the display electrode 800 is arranged on the insulating layer 700. The display electrode 800 is connected with the thin film transistor 900 through the through hole 724 penetrating the insulating layer 700. On the display electrode 800, the pixel defining pattern 500 (the third defining structure 530), the light-emitting functional layer 300, the first electrode 400, and the encapsulation layer 120 are sequentially arranged.

As illustrated in FIG. 11, the display electrode 800 includes a first display electrode part 810, a second display electrode part 820, and a third display electrode part 830, the first display electrode part 810 is located in the same layer as the first connection electrode 210, the second display electrode part 820 and the first connection part 221 are located in the same layer, and the third display electrode part 830 and the second connection part 222 are located in the same layer. Because in the display region, the first electrode 400 does not need to be connected with the conductive element below the first electrode 400, thus the dimension of the end of the first display electrode part 810 protruding from the end of the second display electrode part 820 is smaller than the dimension of the first connection electrode 210 protruding from the first connection part 221.

For example, as illustrated in FIG. 11, the pixel defining pattern 500 further includes a second opening 531, the second opening 531 exposes at least a part of the display electrode 800. The third defining structure 530 is arranged around the second opening 531 to cover the end of the display electrode 800, and the first electrode 400 is continuous at the second opening 531.

As illustrated in FIG. 11 and FIG. 12, the second opening 531 corresponds to the light-emitting region R0 of the light-emitting element.

FIG. 11 and FIG. 12 illustrate the encapsulation layer 120. The encapsulation layer 120 is configured to encapsulate the light-emitting element to avoid water and oxygen attack. The encapsulation layer 120 also covers structures within the connection region. For example, the encapsulation layer 120 is in a form of an entire film. For example, the encapsulation layer 120 may include a film stack formed by three films of an inorganic encapsulation film, an organic encapsulation film, and an inorganic encapsulation film arranged in sequence.

In the embodiment of the present disclosure, the separation structure 230 is arranged at an end surface of the second connection electrode 220, and the end surface of the first connection electrode 210 is not arranged with a separation structure are taken as an example, however, the setting method is not limited to this. In other embodiments, the end surface of the first connection electrode 210 may also be arranged with a separation structure, the separation structure at the end surface of the first connection electrode 210 is similar to the separation structure 230 at the end surface of the first connection electrode 210. In this case, the first connection electrode 210 may include two connection parts. These two connection parts are similar to the first connection part 221 and the second connection part 222 respectively. That is, at least one of the first connection electrode 210 and the second connection electrode 220 is provided with the separation structure 230.

The embodiment of the present disclosure is described by taking the separation structure 230 located at the end as an example, however, in other embodiments, the separation structure 230 may not be located at the end.

For example, the separation structure 230 may be located at the edge of the conductive connection member. Embodiments of the present disclosure are described by taking the separation structure 230 located at the outer edge of the conductive connection member as an example.

For example, in the case that the conductive connection member includes an inner edge and an outer edge, the separation structures 230 may be arranged at the inner edge and the outer edge of the conductive connection member, respectively.

In an embodiment of the present disclosure, the thickness of the passivation layer 710 is smaller than the thickness of the planarization layer 720. The passivation layer 710 can be made of an inorganic insulating material, and the planarization layer 720 can be made of an organic insulating material. The buffer layer 910 and the insulating layer 920 may use an inorganic insulating material. For example, the inorganic insulating material includes at least one of silicon oxide, silicon nitride, and silicon oxynitride, but is not limited to this. The organic insulating material includes resin or polyimide, but is not limited to this. The base substrate BS may use glass or polyimide, but is not limited to this.

The display panel provided by the embodiments of the present disclosure may not be limited by the design of the backplane and the material of the organic light-emitting diode (OLED), and is compatible with all OLED screen designs.

Another embodiment of the present disclosure provides a display device, and the display device may include the display panel provided by any one of the embodiments illustrated in FIG. 2 to FIG. 11. In the display device provided by the embodiments of the present disclosure, a conductive connection member is arranged in the display panel, the light-emitting functional layer is disconnected by the separation structure at the end of the conductive connection member, so that the first electrode is connected with the conductive connection member. The conductive connection member is connected with the auxiliary electrode, to reduce the voltage drop of the first electrode. In some embodiments, at least a part of the edge of the second connection electrode in the conductive connection member is covered by the pixel defining structure such that the first electrode is continuous, so that the part of the first electrode at the connection region and the part of the first electrode at the display region are still interconnected as an integrated pattern, and the final overlap-contact effect is improved.

For example, the display device may be a display device such as an organic light-emitting diode display device, and any product or component with a display function such as a TV, a digital camera, a mobile phone, a watch, a tablet computer, a notebook computer and a navigator that include the display device.

Another embodiment of the disclosure provides a manufacturing method of a display panel. The manufacturing method includes: providing a base substrate; forming a conductive connection member on a base substrate, in which forming the conductive connection member includes sequentially forming a first connection electrode and a second connection electrode, forming a separation structure at the end of the second connection electrode while forming the conductive connection member; forming a light-emitting functional layer on the conductive connection member, in which the light-emitting functional layer is disconnected by a separation structure at at least a part of the edge of the conductive connection member; and forming a first electrode on the light-emitting functional layer, in which the first electrode is connected with the conductive connection member at the separation structure. In the embodiment of the present disclosure, a conductive connection member is arranged in the connection region of the display panel, and a separation structure is formed at an end of the second connection electrode of the conductive connection member, for example, the separation structure may be formed by over-etching. In a region where the separation structure is not covered by a pixel defining structure, the separation structure can disconnect the light-emitting functional layer, so that the first electrode is connected with the conductive connection member; while the first electrode is continuous at the region where the separation structure is covered by a pixel defining structure, and forms a pattern integrated with the part of the first electrode in the display region, so that the final overlap-contact effect is improved.

FIG. 13 to FIG. 20 are process flow charts of a manufacturing method of a display panel provided by an embodiment of the present disclosure. The display panel provided by the embodiment illustrated in FIG. 2 to FIG. 11 can be formed by using the manufacturing method illustrated in FIG. 13 to FIG. 20.

As illustrated in FIG. 2 to FIG. 13, the manufacturing method of the display panel includes the following steps.

Step S1: providing a base substrate 110.

Step S2: forming a shielding electrode 911 on the base substrate 110.

Step S3: forming a buffer film on the shielding electrode 911.

Step S4: forming a semiconductor layer 921 on the buffer film.

Step S5: forming a gate insulating layer (GI) 931 and a gate electrode 932.

Step S6: forming an interlayer insulating film, and performing a process of forming a via hole (through a patterning process to form the via hole), to form the through hole 9201, the through hole 9202, and the through hole 9203, and forming a buffer layer 910 and an interlayer insulating layer (ILD) 920.

For example, the gate insulating layer 931 and the gate electrode 932 can be formed by using the same mask.

In the above step S1 to step S6, the shielding electrode 911, the semiconductor layer 921, the gate insulating layer (GI) 931, the gate electrode 932, the through hole 9201, the through hole 9202, and the through hole 9203 are all located in the display region 12. In the above step S1 to step S6, the base substrate 110, the buffer layer 910, and the interlayer insulating layer (ILD) 920 are common layers of the connection region 11 and the display region 12.

As illustrated in FIG. 2 to FIG. 14, the manufacturing method of the display panel further includes the following steps.

Step S7: forming an auxiliary electrode 600, a drain electrode 610, and a source electrode 620 on the interlayer insulating layer 920.

Step S8: forming a passivation film 7100 and a planarization film 7200 on the auxiliary electrode 600, the drain electrode 610, and the source electrode 620.

In the above step S7 and step S8, the auxiliary electrode 600 and the first through hole 711 are located in the connection region 11, the drain electrode 610, the source electrode 620, and the through hole 712 are located in the display region 12, the passivation layer 710 and the planarization layer 720 are common layers for the connection region 11 and the display region 12.

As illustrated in FIG. 2 to FIG. 15, the manufacturing method of the display panel further includes the following steps.

Step S9, patterning the planarization film 7200 first, and then patterning the passivation film 7100, and forming a passivation layer 710, a first through hole 711 penetrating the passivation layer 710, a planarization layer 720, a through hole 724 penetrating the planarization layer 720 and the passivation layer 710, and a second through hole 723 penetrating the planarization layer 720.

Figure 15:
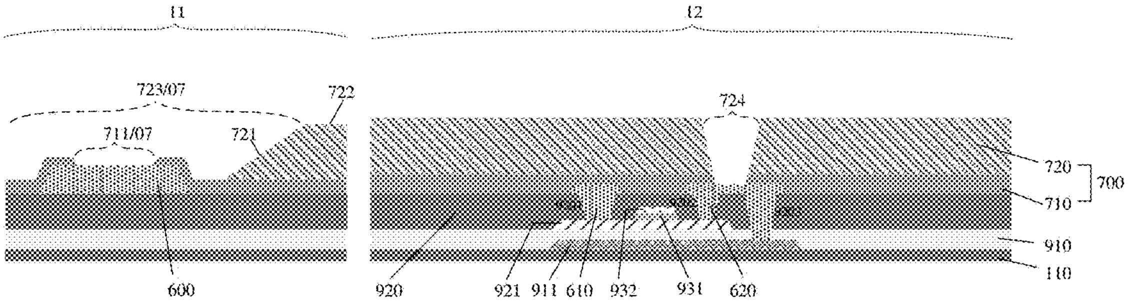
Figure 16:
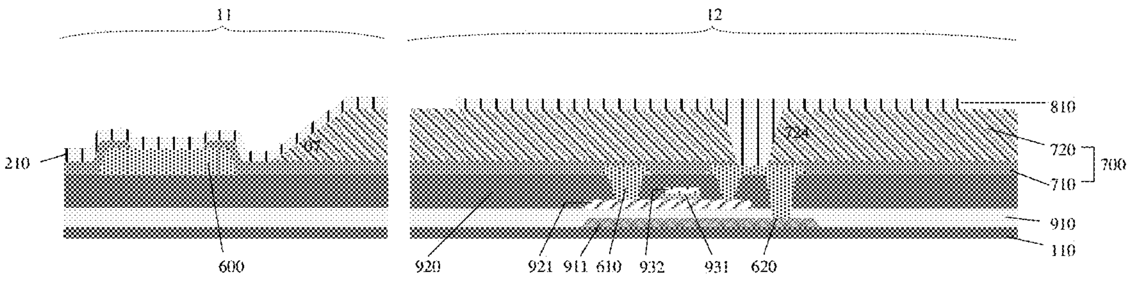

As illustrated in FIG. 15, the first through hole 711 and the second through hole 723 constitute the via hole 07, the via hole 07 exposes the auxiliary electrode 600, and the through hole 724 exposes the source electrode 620.

In step S9, patterning the planarization film 7200 first, and then patterning the passivation film 7100, so that the via hole 07 includes two through holes with different diameters, which is more conducive to the connection of the conductive connection member and the auxiliary electrode 600.

As illustrated in FIG. 15, the planarization layer 720 includes a slope part 721 and a flat part 722, and the slope part 721 is located in the connection region 11.

As illustrated in FIG. 15, the drain electrode 610 is connected with the semiconductor layer 921 through the through hole 9201 penetrating the interlayer insulating layer 920, the source electrode 620 is connected with the semiconductor layer 921 through the through hole 9202 penetrating the interlayer insulating layer 920, the source electrode 620 is connected with the shielding electrode 911 through the through hole 9203 penetrating the interlayer insulating layer 920 and the buffer layer 910. In other embodiments, the shielding electrode 911 may be connected with another conductive element arranged in the same layer as the source electrode 620.

As illustrated in FIG. 15, the auxiliary electrode 600, the drain electrode 610 and the source electrode 620 are formed of the same film layer by the same patterning process.

As illustrated in FIG. 2 to FIG. 16, the manufacturing method of the display panel further includes the following steps.

Step S10: forming a first connection electrode 210 and a first display electrode part 810.

In the step S10, the first connection electrode 210 and the first display electrode part 810 are formed of the same film layer by the same patterning process. The first connection electrode 210 is located in the connection region 11, and the first display electrode part 810 is located in the display region 12.

As illustrated in FIG. 2 to FIG. 17, the manufacturing method of the display panel further includes the following steps.

Step S11: forming a first connection material film 8200 and a second connection material film 8300, and forming a photoresist pattern 850 on the second connection material film 8300.

As illustrated in FIG. 2 to FIG. 18, the manufacturing method of the display panel further includes the following steps.

Figure 17:
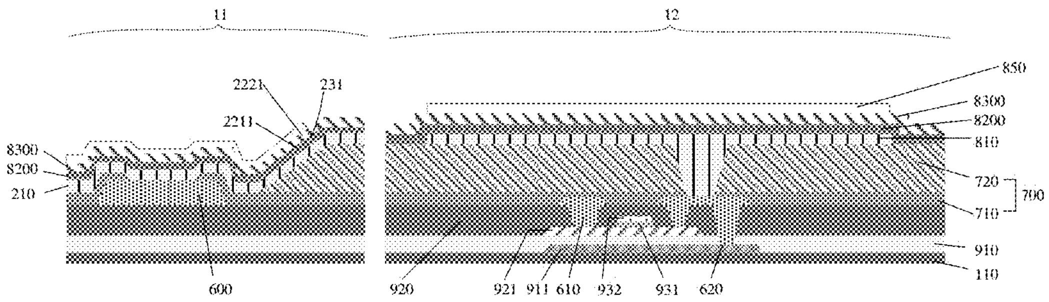
Figure 18:
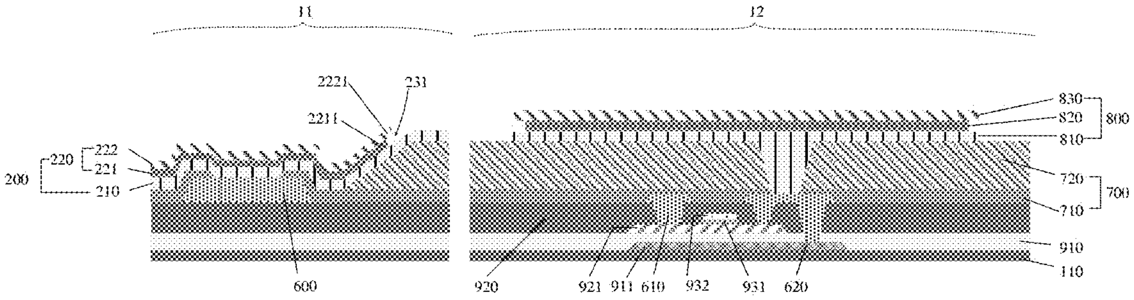

Step S12: as illustrated in FIG. 17 and FIG. 18, etching the first connection material film 8200 and the second connection material film 8300 by using the photoresist pattern 850 as a mask, and forming a first connection part 221 and a second connection part 222.

For example, an etching rate of the material of the second connection part 222 is lower than an etching rate of the material of the first connection part 221, to form a groove (over-etching hole) 231 during etching so that an end of the second connection part 222 protrudes relative to an end of the first connection part 221. The groove (over-etching hole) 231 as a separation structure can be used to disconnect a subsequently formed light-emitting functional layer.

For example, as illustrated in FIG. 18, the first connection part 221 and the second connection part 222 constitute a second connection electrode 220. The first connection electrode 210 and the second connection electrode 220 constitute a conductive connection member 200.

As illustrated in FIG. 18, the second display electrode part 820 is formed simultaneously with the formation of the first connection part 221, the third display electrode part 830 is formed simultaneously with the formation of the second connection part 222. For example, the dimension of the second display electrode part 820 being inwardly recessed relative to the first display electrode part 810 is smaller than the dimension of the first connection portion 221 being inwardly recessed relative to the first connection electrode 210. For example, a dimension of the end of the first display electrode part 810 protruding from the end of the second display electrode part 820 is smaller than a dimension of the first connection electrode 210 protruding from the first connection part 221.

As illustrated in FIG. 2 to FIG. 20, the manufacturing method of the display panel further includes the following steps.

Step S13, forming a pixel defining pattern 500.

Figure 19:
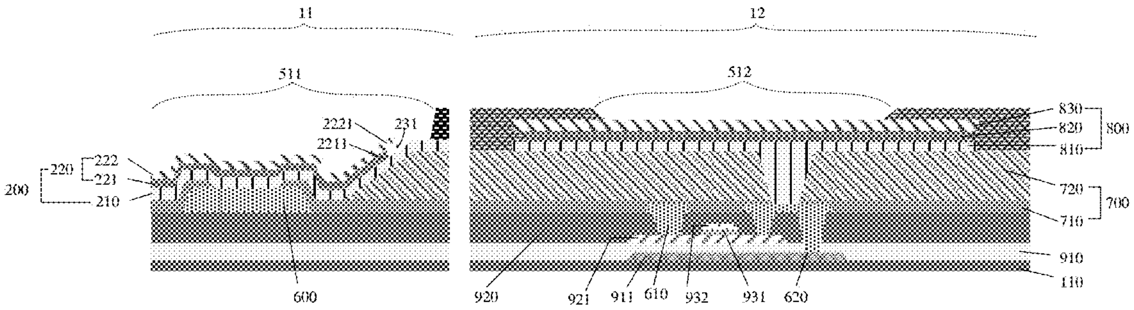
Figure 20:
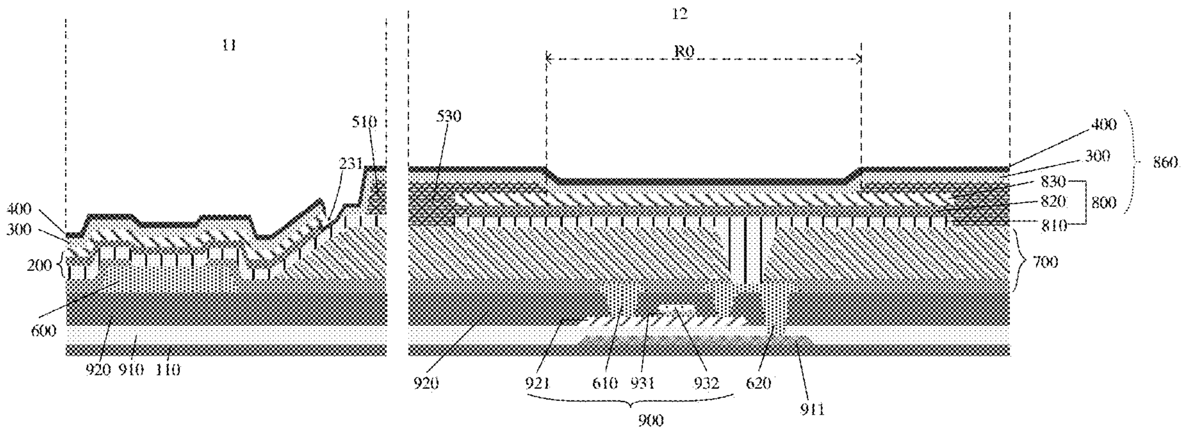

As illustrated in FIG. 19, the pixel defining pattern 500 includes a first opening 511 located in the connection region 11 and a second opening 512 located in the display region, and the first opening 511 exposes at least a part of edges of the second connection electrode 220.

As illustrated in FIG. 2 to FIG. 20, the manufacturing method of the display panel further includes the following steps.

Step S14: forming a light-emitting functional layer 300.

Step S15: forming the first electrode 400.

For example, the manufacturing method of the display panel further includes the following steps.

Step S16: forming an encapsulation layer 120. Thus, the display panel illustrated in FIG. 12 was formed.

For example, the light-emitting functional layer 300 can be formed on an entire surface by an open mask by an evaporation process.

For example, the first electrode 400 can be formed on an entire surface by an open mask by a sputtering process.

For example, referring to FIG. 3, FIG. 12, and FIG. 13 to FIG. 20, embodiments of the present disclosure provide a manufacturing method of a display panel, which includes: providing a base substrate 110; forming a conductive connection member 200 on the base substrate 110, in which forming the conductive connection member 200 includes sequentially forming the first connection electrode 210 and the second connection electrode 220, and forming a separation structure 230 at an end of the second connection electrode 220 while forming the conductive connection member 200; forming a light-emitting functional layer 300 on the conductive connection member 200, in which the light-emitting functional layer 300 is disconnected by the separation structure 230 at at least a part of the edge of the conductive connection member 200; and forming a first electrode 400 on the light-emitting functional layer 300; the first electrode 400 is connected with the conductive connection member 200 at the position of the separation structure 230. For example, as illustrated in FIG. 5, the separation structure 230 includes a groove 231, an angle A0 between an orientation of the groove 231 and the base substrate BS is an acute angle.

For example, referring to FIG. 3, FIG. 12, and FIG. 13 to FIG. 20, in the manufacturing method, forming the second connection electrode 220 includes: forming a first connection material film 8200 and a second connection material film 8300, forming a photoresist pattern 850 on the second connection material film 8300, etching the first connection material film 8200 and the second connection material film 8300 by using the photoresist pattern 850 as a mask, and forming a first connection part 221 and a second connection part 222; an etching rate of a material of the second connection part 222 is lower than an etching rate of a material of the first connection part 221, to form an over-etching hole during etching, so that the first connection part 221 is inwardly recessed relative to the second connection part 222, that is, the end of the second connection part 222 protrudes relative to the end of the first connecting part 221.

For example, referring to FIG. 3, FIG. 12, FIG. 13 to FIG. 20, in the manufacturing method, after forming the conductive connection member 200, and before forming the first electrode 400, the manufacturing method further includes forming a pixel defining pattern 500; the pixel defining pattern 500 includes a first opening 511, and the first opening 511 exposes at least a part of the edges of the second connection electrode 220.

The above are only specific embodiments of the present disclosure, but the protection scope of the present disclosure is not limited thereto. Any person skilled in the art can easily think of changes or substitutions within the technical scope disclosed in the present disclosure, it should be covered within the protection scope of the present disclosure. Therefore, the protection scope of the present disclosure should be defined by the protection scope of the claims.

The invention claimed is:

1. A display panel, comprising:

a base substrate;

a conductive connection member, located on the base substrate, and comprising a separation structure;

a light-emitting functional layer, located on a side of the conductive connection member facing away from the base substrate, and disconnected at the separation structure;

a first electrode, located on a side of the light-emitting functional layer facing away from the base substrate; and an auxiliary electrode, located on a side of the conductive connection member close to the base substrate, wherein the first electrode is connected with the conductive connection member at the separation structure, the first electrode is connected with the auxiliary electrode through the conductive connection member, and the separation structure comprises a groove, and an angle between an orientation of the groove and the base substrate is an acute angle, wherein the conductive connection member comprises a first connection electrode and a second connection electrode, the first connection electrode is closer to the base substrate than the second connection electrode, and the second connection electrode has the separation structure, the display panel further comprising: a pixel defining pattern, wherein the pixel defining pattern is arranged between the light-emitting functional layer and the first connection electrode, the pixel defining pattern comprises a first opening, a first defining structure, and a second defining structure, and the first defining structure and the second defining structure form at least a part of the first opening, in a plan view of the display panel, an outer edge of the second connection electrode has a ring structure, a first part of the ring structure is exposed by the first opening to form the separation structure, an orthographic projection of the first part of the ring structure on the base substrate is not overlapped with an orthographic projection of the first defining structure on the base substrate, a second part of the ring structure is located between the second defining structure and the base substrate, and the second part of the ring structure is covered by the second defining structure.

2. The display panel according to claim 1, wherein the first connection electrode and the second connection electrode are located in different layers.

3. The display panel according to claim 1, wherein the second connection electrode comprises a first connection part and a second connection part, the first connection part is closer to the base substrate than the second connection part, and the first connection part is inwardly recessed than the second connection part at a side surface of the second connection electrode to form the groove, so as to form the separation structure.

4. The display panel according to claim 3, wherein a material of the first connection part comprises metal, and a material of the second connection part and a material of the first connection electrode comprise conductive metal oxide, wherein the groove comprises an over-etching hole.

5. The display panel according to claim 3, wherein a dimension of the second connection part protruding from the first connection part is greater than a thickness of the light-emitting functional layer, wherein a dimension of the second connection part protruding from the first connection part is greater than or equal to a thickness of the first connection part.

6. The display panel according to claim 3, wherein a length of a contact part between the first electrode and the first connection electrode is greater than a dimension of the second connection part protruding from the first connection part.

7. The display panel according to claim 3, further comprising a functional electrode, wherein the functional electrode is adjacent to the auxiliary electrode, an orthographic projection of the functional electrode on the base substrate is not overlapped with an orthographic projection of the auxiliary electrode on the base substrate, an orthographic projection of the separation structure on the base substrate is not overlapped with the orthographic projection of the functional electrode on the base substrate.

8. A display panel, comprising:

a base substrate;

a conductive connection member, located on the base substrate, and comprising a separation structure;

a light-emitting functional layer, located on a side of the conductive connection member facing away from the base substrate, and disconnected at the separation structure;

a first electrode, located on a side of the light-emitting functional layer facing away from the base substrate; and an auxiliary electrode, located on a side of the conductive connection member close to the base substrate, wherein the first electrode is connected with the conductive connection member at the separation structure, the first electrode is connected with the auxiliary electrode through the conductive connection member, and the separation structure comprises a groove, and an angle between an orientation of the groove and the base substrate is an acute angle, wherein the conductive connection member comprises a first connection electrode and a second connection electrode, the first connection electrode is closer to the base substrate than the second connection electrode, and the second connection electrode has the separation structure, wherein the second connection electrode comprises a first connection part and a second connection part, the first connection part is closer to the base substrate than the second connection part, and the first connection part is inwardly recessed than the second connection part at a side surface of the second connection electrode to form the groove, so as to form the separation structure, the display panel further comprising: an insulating layer, wherein the insulating layer is located between the auxiliary electrode and the conductive connection member, and the conductive connection member is connected with the auxiliary electrode through a via hole penetrating the insulating layer, wherein the insulating layer comprises a passivation layer and a planarization layer, wherein the passivation layer is closer to the base substrate than the planarization layer, the via hole comprises a first through hole penetrating the passivation layer and a second through hole penetrating the planarization layer, an orthographic projection of the first through hole on the base substrate falls within an orthographic projection of the second through hole on the base substrate, and an orthographic projection of the first through hole on the base substrate falls within the orthographic projection of the auxiliary electrode on the base substrate.

9. The display panel according to claim 8, wherein the first electrode is in contact with at least a part of a side surface of the second connection electrode.

10. The display panel according to claim 8, wherein an orthographic projection of the first connection electrode on the base substrate is larger than an orthographic projection of the second connection electrode on the base substrate, wherein the first electrode is in contact with a surface of the first connection electrode facing away from the base substrate.

11. The display panel according to claim 8, further comprising: a pixel defining pattern, wherein the pixel defining pattern is arranged between the light-emitting functional layer and the first connection electrode, the pixel defining pattern comprises a first opening, and the first opening exposes the separation structure on at least one side of the second connection electrode.

12. The display panel according to claim 11, wherein the pixel defining pattern further comprises a first defining structure forming at least a part of the first opening, an orthographic projection of the first defining structure on the base substrate is not overlapped with an orthographic projection of the separation structure on the base substrate, and the first defining structure is located on at least one side of the first opening.

13. The display panel according to claim 11, wherein the pixel defining pattern further comprises a second defining structure forming at least a part of the first opening, the second defining structure covers the separation structure on at least one side of the second connection electrode, and the second defining structure is located on at least one side of the first opening.

14. The display panel according to claim 8, wherein the insulating layer comprises a slope part for forming the via hole, and an orthographic projection of the separation structure on the base substrate is located within an orthographic projection of the slope part on the base substrate, the insulating layer further comprises a flat part, and the first connection electrode extends from the slope part to the flat part, and a dimension of the slope part in a radial direction of the via hole is greater than a space between the slope part and the auxiliary electrode in the radial direction of the via hole.

15. The display panel according to claim 14, wherein the first electrode is divided into a first conductive part and a second conductive part that are spaced apart from each other by the separation structure, an orthographic projection of the first conductive part on a surface of the slope part for forming the via hole is overlapped with an orthographic projection of the second conductive part on the surface of the slope part for forming the via hole.

16. The display panel according to claim 15, wherein an overlapping dimension of the orthographic projections of the first conductive part and the second conductive part on the surface of the slope part for forming the via hole is smaller than a dimension of the second connection part protruding from the first connection pat.

17. The display panel according to claim 14, wherein the light-emitting functional layer is divided into a first light-emitting functional part and a second light-emitting functional part that are spaced apart from each other by the separation structure, an orthographic projection of the first light-emitting functional part on the base substrate is overlapped with an orthographic projection of the auxiliary electrode on the base substrate, and an slope angle of the slope part is larger than an angle between a part of the second light-emitting functional part close to the separation structure and the first connection electrode.

18. The display panel according to claim 3, further comprising: a display electrode, wherein the display electrode comprises a first display electrode part, a second display electrode part, and a third display electrode part, the first display electrode part is located in a same layer as the first connection electrode, the second display electrode part is located in a same layer as the first connection part, the third display electrode part is located in a same layer as the second connection part, and a dimension of the first display electrode part protruding from the second display electrode part is smaller than a dimension of the first connection electrode protruding from the first connection part.

19. A display device, comprising the display panel according to claim 1.

20. A manufacturing method of a display panel, comprising:

providing a base substrate;

forming an auxiliary electrode on the base substrate;

forming a conductive connection member on the auxiliary electrode, wherein the conductive connection member comprises a separation structure;

forming a light-emitting functional layer on the conductive connection member, wherein the light-emitting functional layer is disconnected at the separation structure; and forming a first electrode on the light-emitting functional layer, wherein the first electrode is connected with the conductive connection member at the separation structure, the first electrode is connected with the auxiliary electrode through the conductive connection member, the separation structure comprises a groove, and an angle between an orientation of the groove and the base substrate is an acute angle, wherein forming the conductive connection member comprises forming a first connection electrode and forming a second connection electrode, the first connection electrode is closer to the base substrate than the second connection electrode, and the second connection electrode has the separation structure, the manufacturing method further comprising: forming a pixel defining pattern, wherein the pixel defining pattern is arranged between the light-emitting functional layer and the first connection electrode, the pixel defining pattern comprises a first opening, a first defining structure, and a second defining structure, and the first defining structure and the second defining structure form at least a part of the first opening, in a plan view of the display panel, an outer edge of the second connection electrode has a ring structure, a first part of the ring structure is exposed by the first opening to form the separation structure, an orthographic projection of the first part of the ring structure on the base substrate is not overlapped with an orthographic projection of the first defining structure on the base substrate, a second part of the ring structure is located between the second defining structure and the base substrate, and the second part of the ring structure is covered by the second defining structure.

* * * * *